United States Patent
Matsumoto

(10) Patent No.: US 6,720,656 B2
(45) Date of Patent: Apr. 13, 2004

(54) SEMICONDUCTOR DEVICE WITH ANALYSIS PREVENTION FEATURE

(75) Inventor: Hironori Matsumoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/322,572

(22) Filed: Dec. 19, 2002

(65) Prior Publication Data

US 2003/0107135 A1 Jun. 12, 2003

Related U.S. Application Data

(62) Division of application No. 09/468,108, filed on Dec. 21, 1999.

(30) Foreign Application Priority Data

Dec. 21, 1998 (JP) ............................................ 10-362335

(51) Int. Cl.⁷ .............................................. H01L 23/48
(52) U.S. Cl. ........................ 257/752; 257/761; 257/922
(58) Field of Search ................................ 257/922, 761, 257/752

(56) References Cited

U.S. PATENT DOCUMENTS

| 5,369,299 A |   | 11/1994 | Byrne |         |
|-------------|---|---------|-------|---------|
| 5,374,455 A |   | 12/1994 | Patel et al. | |
| 5,468,990 A |   | 11/1995 | Daum  |         |
| 5,920,112 A | * | 7/1999  | Datri et al. | 257/619 |
| 6,107,199 A | * | 8/2000  | Allen et al. | 438/685 |

FOREIGN PATENT DOCUMENTS

| JP | 61051950   | 3/1986  |
| JP | 62-061358  | 3/1987  |
| JP | 64-36032   | 2/1989  |
| JP | 1-165129   | 6/1989  |
| JP | 1-214126   | 8/1989  |
| JP | 1-286454   | 11/1989 |
| JP | 2-209735   | 8/1990  |
| JP | 9-5770     | 1/1997  |
| JP | 9-502834   | 3/1997  |

* cited by examiner

*Primary Examiner*—T. N. Quach
(74) *Attorney, Agent, or Firm*—Nixon & Vanderhye P.C.

(57) ABSTRACT

A semiconductor device includes a semiconductor substrate having a main circuit part including a predetermined active element and the like on a silicon substrate, an interconnection transmitting to the active element an externally supplied input signal or transmitting an output signal to be supplied to any external unit, an opening for input/output of the externally supplied signal or the signal to be supplied to any external unit to and from the interconnection, an insulating protection film for protecting the interconnection and an underlying portion thereof, a conductive metal film arranged above the main circuit part, and an aluminum oxide film arranged to cover the conductive metal film. This structure can preclude the main circuit part from being discerned by visual observation, a visible light microscope and an IR microscope, and accordingly imitation, copy and altering of the main circuit part by other people can be prevented.

5 Claims, 4 Drawing Sheets

SEMICONDUCTOR DEVICE WITH ANALYSIS PREVENTION FEATURE

This application is a Divisional of Application No. 09/468,108, filed Dec. 21, 1999.

BACKGROUND OF THE INVENTION

1. Field of the Invention

The present invention relates to semiconductor devices, and particularly to a semiconductor device configured to prevent analysis of the structure of its circuit component portion and to make it difficult copy or altering of information in the circuit.

2. Description of the Background Art

In a semiconductor device, a number of semiconductor elements formed on a substrate with electrode interconnection established are generally protected from influences of ambience such as alpha ray, moisture and stress by covering a circuit component portion with an insulating protection film so as to prevent malfunction due to moisture invasion and the like, change in characteristics caused by stress, and the like. A silicon oxide film, a silicon nitride film and the like are usually employed as the protection film covering the circuit component portion.

There are some circuit component portions of semiconductor devices which have taken a long period of time for development thereof or which are superior in originality. Therefore, they should preferably be protected from imitation and copy thereof by other people. Further, there is some memory device storing important information in the circuit of the semiconductor device, and thus the information should preferably be protected from being altered.

However, the insulating protection film mentioned above is provided for protecting the circuit component portion from ambience. Therefore, the film is usually superior in optical transmissivity relative to visible light and far-infrared radiation, so that the circuit component can easily be discerned from above the protection film by a visible light microscope or an IR (infrared) microscope, leading to a high possibility of imitation and copy of the circuit component portion or altering of the information in the memory device.

SUMMARY OF THE INVENTION

The present invention is made to solve those problems described above. One object of the invention is to provide a semiconductor device having a circuit component portion which is difficult to analyze so as to prevent copy, imitation and altering of information by other people.

According to one aspect of the present invention, a semiconductor device includes a substrate having a circuit component portion, an insulating protection film formed to cover the circuit component portion, an analysis prevention film formed on the protection film to cover a main part of the circuit component portion for preventing analysis of the main part, and a corrosion resistant film formed to cover the analysis prevention film for preventing the analysis prevention film from being ruined by a chemical solution.

Employment of the structure above, which has the analysis prevention film covering the main part, can make it impossible to analyze an underlying circuit pattern.

According to another aspect of the present invention, a semiconductor device includes a substrate having a circuit component portion, an insulating protection film formed to cover the circuit component portion, and an analysis prevention film formed on the protection film to cover a main part of the circuit component portion for preventing analysis of the main part, the analysis prevention film having corrosion resistance for preventing itself from being ruined by a chemical solution.

Employment of the above structure can deter an attempt to achieve analysis by performing chemical solution processing on the analysis prevention film for removing the film, since it is difficult to destroy the analysis prevention film by a chemical solution even if a corrosion resistant film is not separately provided.

Preferably, the semiconductor device according to the invention further includes an interconnection which is placed between the substrate and the protection film to reach the circuit component portion. The protection film has an opening located in a region which is not covered with the analysis prevention film to reach the interconnection. Employment of this structure can deter an attempt to remove the analysis prevention film by the chemical solution processing and thus analyze the circuit pattern, since the chemical solution entering through the opening first removes the interconnection and the circuit component portion.

Preferably, in the semiconductor device according to the invention, the analysis prevention film and the protection film have their surfaces substantially at the same height. Further, the surface of the protection film is preferably flat. Employment of this structure can prevent an attempt to recognize the entire shape of underlying interconnections and positional relation thereof based on roughness of the surface.

Preferably, in the semiconductor device according to the present invention, the analysis prevention film is formed of the same material as that of the interconnection. In this structure, if chemical solution processing is performed on the analysis prevention film to eliminate the prevention film, the interconnection could also be eliminated under the same condition and consequently the interconnection disappears before being analyzed. In this way, the analysis can be prevented.

According to the present invention, preferably the analysis prevention film is formed of an electrically conductive metallic film. Employment of this structure in which the analysis prevention film has a low transmissivity relative to visible light and IR radiation can prevent analysis of an underlying circuit pattern.

According to the one aspect of the invention, preferably the electrically conductive metallic film is formed of an electrically conductive metal material. By employing this structure, an analysis prevention film having a low transmissivity relative to visible light and IR radiation can easily be accomplished.

According to the one aspect of the invention, preferably the electrically conductive metallic film is a metallic film formed of at least one of titanium nitride and titanium-tungsten alloy. Even if the analysis prevention film is not formed of a metal material, employment of the structure above can achieve an analysis prevention film having a low transmissivity relative to visible light and IR radiation.

According to the one aspect of the invention, the corrosion resistant film is preferably formed of aluminum oxide. Employment of this structure can protect the analysis prevention film from a chemical solution since the aluminum oxide has a superior corrosion resisting effect.

According to the one aspect of the invention, preferably the corrosion resistant film is formed of dyed aluminum oxide. It is possible to make it further difficult to visibly discern an underlying circuit pattern by employing this structure.

According to the another aspect of the invention above, preferably the analysis prevention film is formed of an electrically conductive metallic film having corrosion resistance. Further, according to the another aspect of the invention, preferably the electrically conductive metallic film is a metal film formed of at least one of tantalum and niobium. Employment of this structure can accomplish an analysis prevention film having corrosion resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in detail in conjunction with the drawings.

First Embodiment

Figure 1:
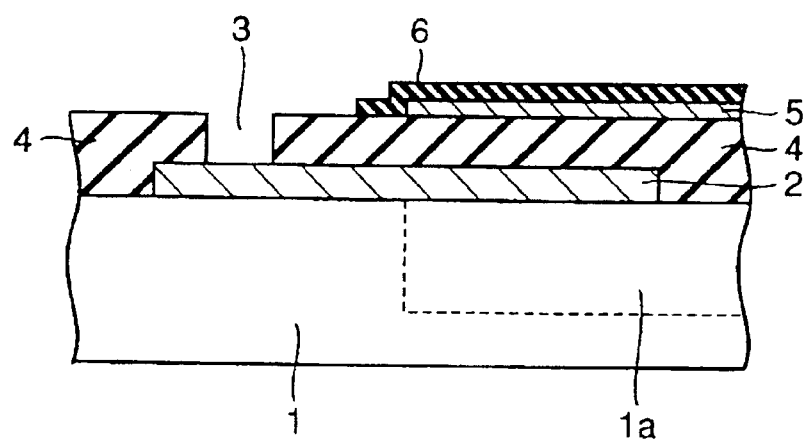
FIG. 1 is a cross sectional view illustrating a main portion of a semiconductor device in a first embodiment of the present invention.

Referring to FIG. 1, a semiconductor device in the first embodiment is constituted of a semiconductor substrate 1 having a main circuit part 1a including a predetermined active element and the like on a silicon substrate, an interconnection 2 transmitting to the active element an externally supplied input signal or transmitting an output signal to be supplied to any external unit, an opening 3 for input/output of the externally supplied signal or the signal to be supplied to any external unit to and from interconnection 2, an insulating protection film 4 for protecting interconnection 2 and an underlying portion thereof, a conductive metal film 5 arranged above main circuit part 1a, and an aluminum oxide film 6 arranged to cover conductive metal film 5.

A fabrication procedure in this embodiment is hereinafter described in conjunction with a process flow shown in FIGS. 2A to 2I.

Figure 2A:
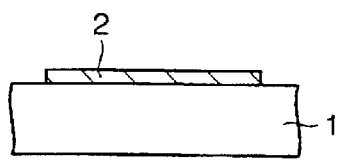
FIGS. 2A to 2I illustrate a process flow of a fabrication procedure in the first embodiment.

Referring to FIG. 2A, a conductive metal film such as an aluminum film or the like is deposited to a thickness of 900 nm on semiconductor substrate 1 having the main circuit part by, for example, sputtering. Resist patterning and dry etching are then conducted to form interconnection 2.

Figure 2B:
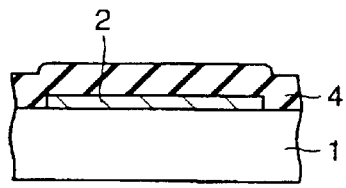

Referring to FIG. 2B, insulating protection film 4 such as a silicon oxide film, a silicon nitride film and the like is deposited to a thickness of 2000 nm on interconnection 2 by, for example, P-CVD (Plasma enhanced CVD).

Figure 2C:
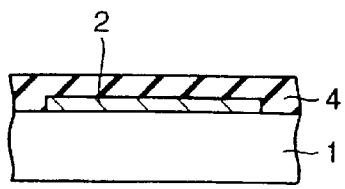

Referring to FIG. 2C, the surface of insulating protection film 4 is planed by a thickness of 1000 nm by, for example, CMP (Chemical Mechanical Polishing) to eliminate surface morphology (unevenness of the surface) and accordingly level the surface. It is noted this step is not the indispensable one and thus can be skipped.

Figure 2D:
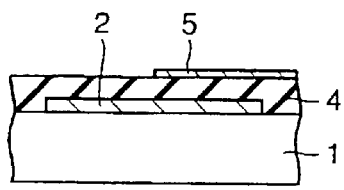

Referring to FIG. 2D, a conductive metal film of the same material as that of interconnection 2, a conductive metal film of another material, or a thin film formed of a material having characteristics similar to those of metal (e.g. titanium nitride film or titanium-tungsten alloy) is deposited to a thickness of 300 nm by, for example, sputtering, and resist patterning and dry etching are conducted to form conductive metal film 5 above the main circuit part.

Figure 2E:
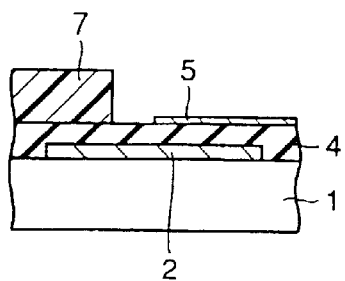

Referring to FIG. 2E, the portion where conductive metal film 5 is absent is covered with a patterned resist 7. At this time, the end of the patterned resist 7 is placed slightly apart from the end of conductive metal film 5 in order to allow conductive metal film 5 to completely be covered with an aluminum oxide film which is formed in the subsequent process step.

Figure 2F:
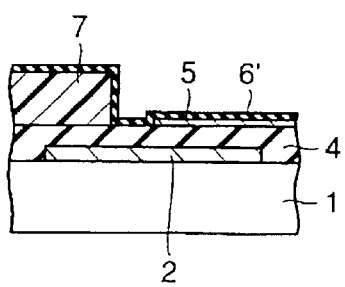

Referring to FIG. 2F, an aluminum film 6' is deposited to a thickness of 150 nm on the entire surface of the substrate by, for example, sputtering.

Figure 2G:
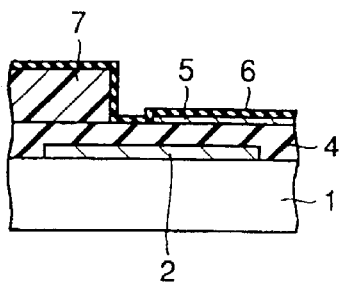

Referring to FIG. 2G, aluminum film 6' is oxidized by anodic oxidationing. The substrate is immersed in an electrolysis solution of ammonium tartrate or the like, positive voltage of approximately several ten volts is applied to the aluminum film portion on the substrate and thus the portion corresponding to the thickness of the aluminum film is oxidized. Since the oxide film has fine holes, the film is immersed in boiling pure water for hole-fill treatment. In this state, aluminum oxide film 6 is present on the entire surface of the substrate. With this state maintained, aluminum oxide film 6 may be dyed by dye stuff.

Figure 2H:
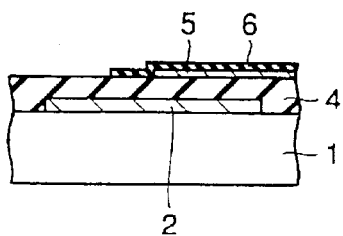

Referring to FIG. 2H, the substrate surface is scrubbed to rub off the oxide film on the resist from the portion at the bottom of the resist with a relatively weak oxide film, and thereafter the resist is removed by using a stripper liquid. If the produced aluminum oxide film pattern has any burr, the substrate surface is scrubbed in this state to remove the burr (lift off method). Cleaning is then carried out to form aluminum oxide film 6 on conductive metal film 5.

Figure 2I:
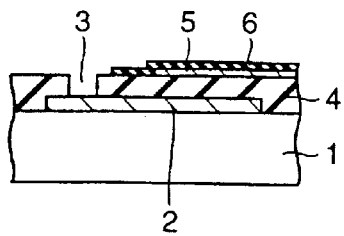

Referring to FIG. 2I, resist patterning and etching of insulating protection film 4 are conducted to form opening 3 for signal input/output.

In the semiconductor device according to this embodiment, the conductive metallic film formed on the insulating protection film makes it impossible to discern the underlying main circuit part by visual observation, a visible light microscope, and an IR microscope. Further, the aluminum oxide film on the conductive metallic film makes it difficult to remove the metallic film by chemical solution processing. If the chemical solution processing is attempted, the chemical solution first enters through the opening on the underlying interconnection, possibly leading to disappearance of the interconnection itself. In this way, imitation and copy of the main circuit part can be prevented and information in a memory device can be secured (altering of the information can be prevented).

Further, discerning of the shape of the underlying interconnection can be made impossible by leveling the surface of the insulating protection film.

Second Embodiment

EXAMPLE 1

Figure 3:
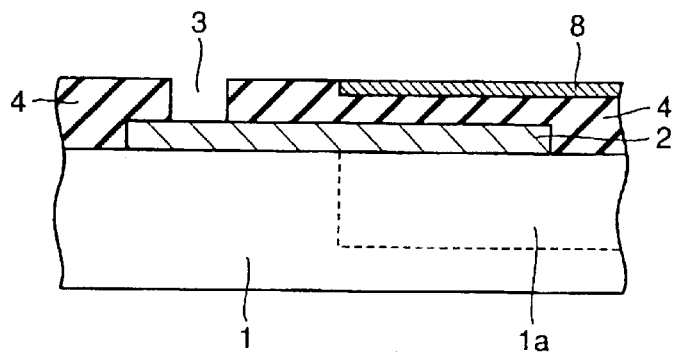
FIG. 3 is a cross sectional view illustrating a main portion of a semiconductor device in Example 1 of a second embodiment of the invention.

Referring to FIG. 3, a semiconductor device in Example 1 is constituted of a semiconductor substrate 1 having a main circuit part 1a including a predetermined active element and the like on a silicon substrate, an interconnection 2 transmitting to the active element an externally supplied input signal or transmitting an output signal to be supplied to any external unit, an opening 3 for allowing input/output of the externally supplied signal or the signal supplied to any external unit to and from interconnection 2, an insulating protection film 4 for protecting interconnection 2 and an underlying portion thereof, and a corrosion resistant conductive metal film 8 arranged above main circuit part 1a.

A fabrication procedure in Example 1 is hereinafter described in conjunction with a process flow shown in FIGS. 4A to 4G.

Figure 4A:
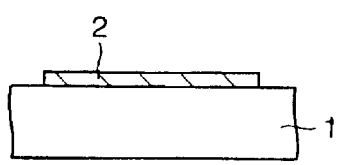
FIGS. 4A to 4G illustrate a process flow of a fabrication procedure in Example 1 of the second embodiment.

Referring to FIG. 4A, a conductive metal film such as an aluminum film or the like is deposited to a thickness of 900 nm on semiconductor substrate 1 having the main circuit part by, for example, sputtering. Resist patterning and dry etching are then conducted to form interconnection 2.

Figure 4B:
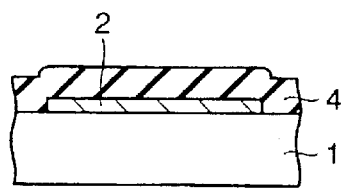

Referring to FIG. 4B, insulating protection film 4 such as a silicon oxide film, a silicon nitride film and the like is deposited to a thickness of 2000 nm on interconnection 2 by, for example, P-CVD.

Figure 4C:
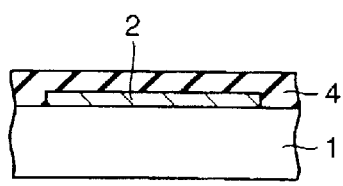

Referring to FIG. 4C, the surface of insulating protection film 4 is planed by a thickness of 1000 nm by, for example, CMP to eliminate surface morphology (unevenness of the surface) and accordingly level the surface.

Figure 4D:
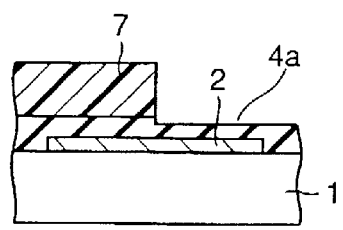

Referring to FIG. 4D, a depression 4a is formed above the main circuit part by resist patterning and dry etching. A patterned resist 7 is provided as shown. The depth of depression 4a is enough if it is equal to the thickness of a corrosion resistant conductive metal film to be deposited on insulating protection film 4.

Figure 4E:
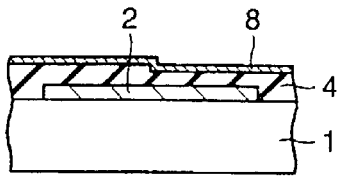

Referring to FIG. 4E, resist 7 is removed, cleaning is conducted, and thereafter corrosion resistant conductive metal film 8, for example, a tantalum film or a niobium film is deposited on the entire surface of the substrate to a thickness of 150 nm.

Figure 4F:
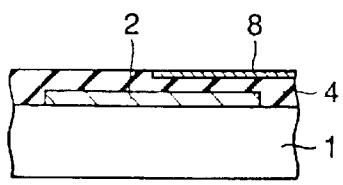

Referring to FIG. 4F, the corrosion resistant conductive metal film on the surface of the substrate is planed off by the thickness corresponding to the metal film by metal CMP. By this processing, it is possible to remove only the portion of the corrosion resistant conductive metal film which does not form the depression of the insulating protection film. Consequently, corrosion resistant conductive metal film 8 can be left in the depression only.

Figure 4G:
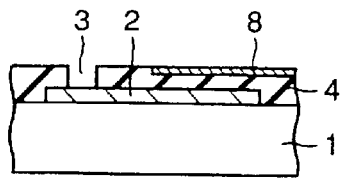

Referring to FIG. 4G, opening 3 for signal input/output is formed by resist patterning and etching of insulating protection film 4.

EXAMPLE 2

Figure 5:
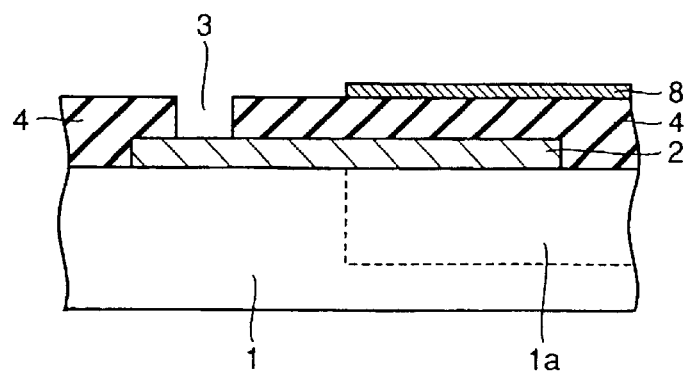
FIG. 5 is a cross sectional view illustrating a main portion of a semiconductor device in Example 2 of the second embodiment of the invention.

Referring to FIG. 5, a semiconductor device in Example 2 is constituted of a semiconductor substrate 1 having a main circuit part 1a including a predetermined active element and the like on a silicon substrate, an interconnection 2 transmitting to the active element an externally supplied input signal or transmitting an output signal to any external unit, an opening 3 for input/output of the externally supplied signal or the signal to be supplied to any external unit to and from interconnection 2, an insulating protection film 4 for protecting interconnection 2 and an underlying portion thereof, and a corrosion resistant conductive metal film 8 arranged above main circuit part 1a. A difference between Example 1 and Example 2 is that no depression is formed in insulating protection film 4 and corrosion resistant conductive metal film 8 is formed on the leveled insulating protection film in the latter.

A fabrication procedure in Example 2 is now described in conjunction with a process flow shown in FIGS. 6A to 6G.

Figure 6A:
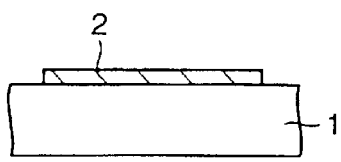
FIGS. 6A to 6G illustrate a process flow of a fabrication procedure in Example 2 of the second embodiment.

Referring to FIG. 6A, a conductive metal film such as an aluminum film or the like is deposited to a thickness of 900 nm on semiconductor substrate 1 having the main circuit part by, for example, sputtering. Resist patterning and dry etching are then conducted to form interconnection 2.

Figure 6B:
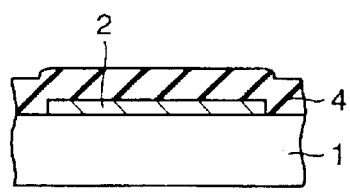

Referring to FIG. 6B, insulating protection film 4 such as a silicon oxide film, a silicon nitride film and the like is deposited to a thickness of 2000 nm on interconnection 2 by, for example, P-CVD.

Figure 6C:
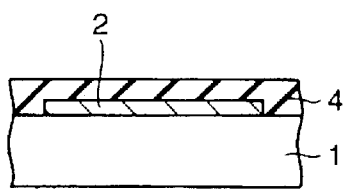

Referring to FIG. 6C, the surface of insulating protection film 4 is planed by a thickness of 1000 nm by, for example, CMP to eliminate surface morphology (unevenness of the surface) and thus level the surface.

Figure 6D:
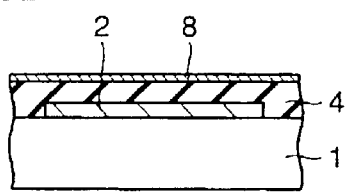

Referring to FIG. 6D, corrosion resistant conductive metal film 8, for example, a tantalum film or a niobium film is deposited on the entire surface of the substrate to a thickness of 150 nm by sputtering.

Figure 6E:
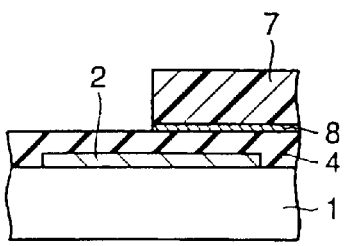
Figure 6F:
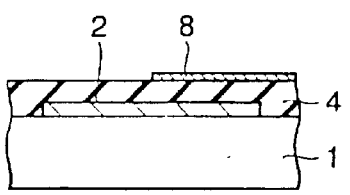

Referring to FIGS. 6E and 6F, resist patterning and dry etching of the corrosion resistant conductive metal film are performed to form corrosion resistant conductive metal film 8 above the main circuit part. Dry etching is effected using $CF_4$-based gas.

Figure 6G:
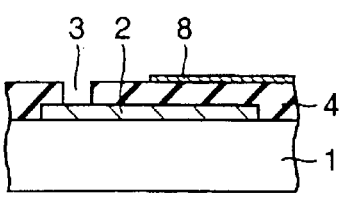

Referring to FIG. 6G, resist patterning and etching of insulating protection film 4 are finally conducted to form opening 3 on the interconnection for input/output of signals.

According to this embodiment, the corrosion resistant conductive metallic film on the insulating protection film prevents the underlying main circuit part from being recognized by visual observation, a visible light microscope and an IR microscope. Further, it is difficult to remove the insulating protection film through chemical solution processing. Even if an attempt to do the chemical solution processing is carried out, the chemical solution first enters through the opening on the underlying interconnection and possibly the interconnection itself disappears. In this way, prevention of imitation and copy of the main circuit part as well as securing of information in a memory device (prevention of altering of the information) are possible. In other words, the second embodiment achieves similar effects to those of the first embodiment even if the aluminum oxide film is not provided.

The leveled surface of the insulating protection film can also prevent discerning of the entire shape and positional relation of underlying interconnections.

Similar techniques are disclosed in Japanese Patent Laying-Open Nos. 9-5770 and 1-214126 and the like. These techniques disclosed are devised in order to protect a semiconductor element from ambience and thus stabilize element characteristics. The element is specifically protected by only a metal film on an insulating protection film and thus those techniques are different from the present invention. Japanese Patent Laying-Open No. 1-165129 discloses a technique devised in order to prevent copy of the circuit component portion similarly to the present invention. However, the structure disclosed is different from that of the present invention. In the former, a protection film formed of the same material as that of an underlying insulating protection film is located on a metal film. Etching of the insulating protection film is stopped when the metal film is exposed, and accordingly etching of only the metal film becomes possible to enable an underlying circuit structure to be discerned.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor device comprising:
    a substrate having a circuit component portion;
    an insulating protection film formed to cover said circuit component portion; and
    an analysis prevention film formed on said protection film to cover a main part of said circuit component portion for preventing analysis of said main part;
    said analysis prevention film having corrosion resistance;
    wherein said analysis prevention film and said protection film have their surfaces at the same height.

2. The semiconductor device according to claim 1, further comprising an interconnection located between said substrate and said protection film to reach said circuit component portion, wherein
    said protection film has an opening located in a region which is not covered with said analysis prevention film to reach said interconnection.

3. The semiconductor device according to claim 1, wherein said protection film has a flat surface.

4. The semiconductor device according to claim 1, wherein said analysis prevention film is formed of an electrically conductive metallic film having corrosion resistance.

5. The semiconductor device according to claim 4, wherein said electrically conductive metallic film is a metal film formed of at least one tantalum and niobium.

* * * * *